United States Patent
Kanaya

(10) Patent No.: US 12,243,962 B2
(45) Date of Patent: Mar. 4, 2025

(54) DISPLAY DEVICE

(71) Applicant: Japan Display Inc., Tokyo (JP)

(72) Inventor: Yasuhiro Kanaya, Tokyo (JP)

(73) Assignee: JAPAN DISPLAY INC., Tokyo (JP)

(*) Notice: Subject to any disclaimer, the term of this patent is extended or adjusted under 35 U.S.C. 154(b) by 404 days.

(21) Appl. No.: 17/560,256

(22) Filed: Dec. 23, 2021

(65) Prior Publication Data

US 2022/0123171 A1    Apr. 21, 2022

Related U.S. Application Data

(63) Continuation of application No. PCT/JP2020/022870, filed on Jun. 10, 2020.

(30) Foreign Application Priority Data

Jun. 25, 2019  (JP) .................................. 2019-117426

(51) Int. Cl.
  *H01L 33/10*  (2010.01)
  *H01L 27/15*  (2006.01)
(52) U.S. Cl.
  CPC ............ *H01L 33/10* (2013.01); *H01L 27/156* (2013.01)
(58) Field of Classification Search
  None
  See application file for complete search history.

(56) References Cited

U.S. PATENT DOCUMENTS

| | | | |
|---|---|---|---|
| 9,082,946 B2 | 7/2015 | Vdovin et al. | |
| 2007/0023774 A1* | 2/2007 | Wirth | H01L 33/20 257/E33.068 |
| 2013/0334559 A1 | 12/2013 | Vdovin et al. | |
| 2015/0169011 A1 | 6/2015 | Bibl et al. | |
| 2016/0004067 A1* | 1/2016 | Zhao | G02B 5/201 216/13 |
| 2017/0154930 A1* | 6/2017 | Kim | H10K 59/122 |
| 2018/0074372 A1 | 3/2018 | Takeya et al. | |
| 2018/0342654 A1 | 11/2018 | Chen | |
| 2019/0006327 A1 | 1/2019 | Kang et al. | |
| 2019/0198593 A1* | 6/2019 | Jo | H10K 50/818 |
| 2020/0343230 A1* | 10/2020 | Sizov | H01L 25/0753 |

FOREIGN PATENT DOCUMENTS

| | | | |
|---|---|---|---|
| JP | H10335706 A | * 12/1998 | |
| JP | 2014-515863 A | 7/2014 | |
| JP | 2016-538586 A | 12/2016 | |
| JP | 2018-10309 A | 1/2018 | |
| KR | 20170079156 A | * 7/2017 | ......... H01L 27/3225 |

(Continued)

OTHER PUBLICATIONS

English translation of KR 20170079156 A (Year: 2017).*

(Continued)

*Primary Examiner* — Khaja Ahmad
(74) *Attorney, Agent, or Firm* — XSENSUS LLP

(57) ABSTRACT

According to one embodiment, a display device includes a first substrate on which a light emitting element is mounted and a second substrate that faces the first substrate. The second substrate includes a reflector plate at a position above the light emitting element and facing a light emission surface of the light emitting element.

6 Claims, 11 Drawing Sheets

(56) References Cited

FOREIGN PATENT DOCUMENTS

WO    2014/149864 A1    9/2014

OTHER PUBLICATIONS

KR 20170079156 A (Year: 2017).*
EEnglish translation of Misawa et al ("Light Emitting Diode Lamp") (Year: 1998).*
English translation of Office Action issued on Apr. 11, 2023, in corresponding Japanese patent Application No. 2019-117426, 5 pages.
International Search Report and Written Opinion mailed on Aug. 11, 2020, received for PCT Application PCT/JP2020/022870, Filed on Jun. 10, 2020, 12 pages including English Translation.

* cited by examiner

DISPLAY DEVICE

CROSS-REFERENCE TO RELATED APPLICATIONS

This application is a Continuation Application of PCT Application No. PCT/JP2020/022870, filed Jun. 10, 2020, and based upon and claiming the benefit of priority from Japanese Patent Application No. 2019-117426, filed Jun. 25, 2019, the entire contents of all of which are incorporated herein by reference.

FIELD

Embodiments described herein relate generally to a display device.

BACKGROUND

An LED display using a light emitting diode (LED) which is a self-light emitting element is known, but in recent years, a display device (hereinafter, referred to as a micro LED display) using a micro diode element called a micro LED has been developed as a display device with higher definition.

Unlike conventional liquid crystal display and organic EL display, this micro LED display is formed by mounting a large number of chip-shaped micro LEDs in a display area, and thus it is easy to achieve both high definition and large size, and is attracting attention as a next-generation display.

However, since the micro LED has a characteristic of diffusing and emitting light in multiple directions, the amount of light in the frontal direction of the micro LED display is small, and there is a possibility of causing a decrease in luminance.

DETAILED DESCRIPTION

Figure 1:
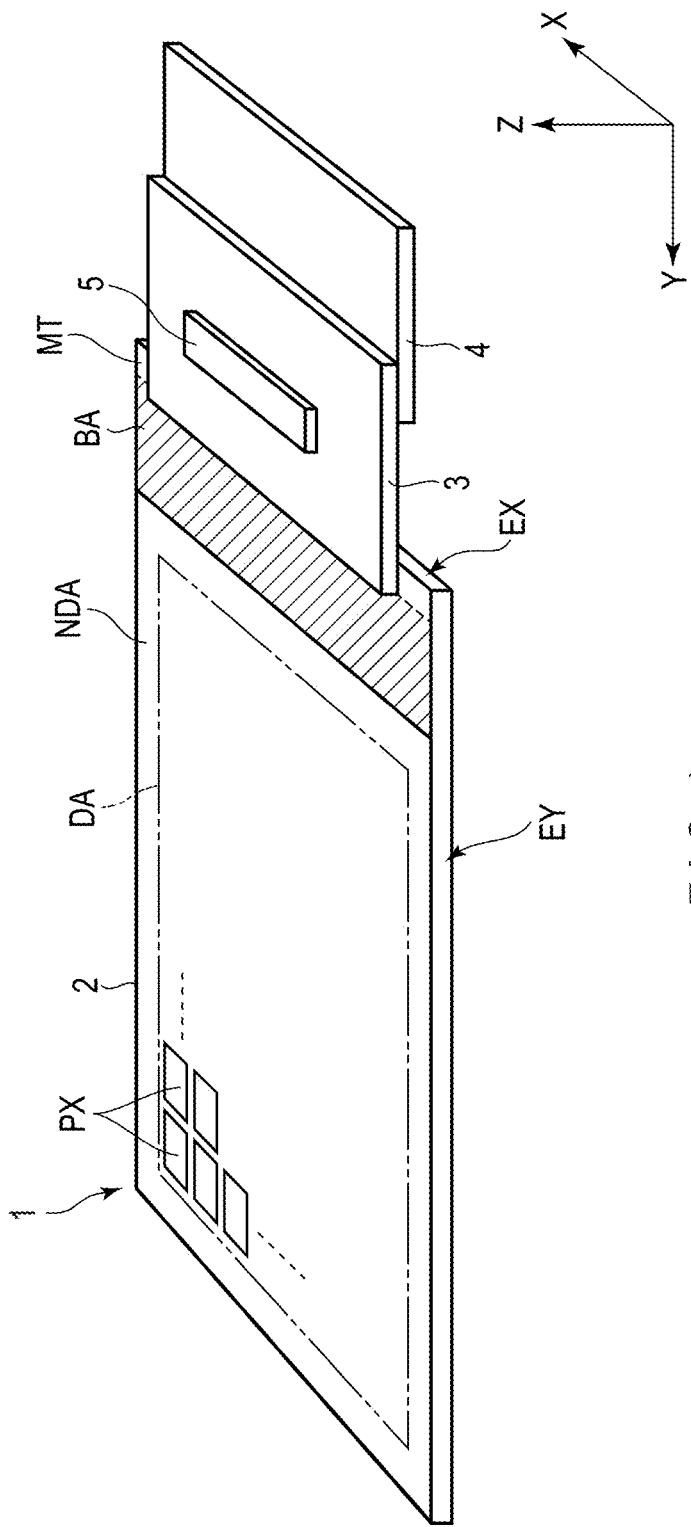
FIG. 1 is a perspective view schematically illustrating a configuration of a display device according to an embodiment.

In general, according to one embodiment, a display device includes a first substrate on which a light emitting element is mounted and a second substrate that faces the first substrate. The second substrate includes a reflector plate at a position above the light emitting element and facing a light emission surface of the light emitting element.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

FIG. 1 is a perspective view schematically showing a configuration of a display device 1 according to one embodiment. FIG. 1 illustrates a three-dimensional space defined by a first direction X, a second direction Y perpendicular to the first direction X and a third direction Z perpendicular to the first direction X and the second direction Y. Note that the first direction X, the second direction Y and the third direction Z are orthogonal are orthogonal to each other, but may intersect at an angle other than 90°.

Hereinafter, in the present embodiment, a case where the display device 1 is a micro LED display (micro LED display) using a micro LED which is a self-light emitting element will be mainly described.

As illustrated in FIG. 1, the display device 1 includes a display panel 2, a first circuit board 3, a second circuit board 4, and the like.

The display panel 2 has a rectangular shape in one example. In the illustrated example, a short side EX of the display panel 2 is parallel to a first direction X, and a long side EY of the display panel 2 is parallel to a second direction Y. A third direction Z corresponds to a thickness direction of the display panel 2. The first direction X may be read as a direction parallel to the short side of the display device 1, the second direction Y may be read as a direction parallel to the long side of the display device 1, and the third direction Z may be read as a thickness direction of the display device 1. A main surface of the display panel 2 is parallel to an X-Y plane defined by the first direction X and the second direction Y. The display panel 2 includes a display area DA and a non-display area NDA outside the display area DA. The non-display area NDA includes a terminal area MT. In the illustrated example, the non-display area NDA surrounds the display area DA.

The display area DA is an area for displaying an image, and includes, for example, a plurality of pixels PX arrayed in a matrix. The pixel PX includes a light emitting element (micro LED), a switching element (a drive transistor) for driving the light emitting element, and the like.

The terminal area MT is provided along the short side EX of the display panel 2 and includes a terminal for electrically connecting the display panel 2 to an external device or the like.

The first circuit board 3 is mounted on the terminal area MT, and is electrically connected to the display panel 2. The first circuit board 3 is, for example, a flexible printed circuit. The first circuit board 3 includes a driver IC chip (hereinafter, referred to as a panel driver) 5 that drives the display panel 2, or the like. In the illustrated example, the panel driver 5 is disposed on the first circuit board 3, but may be disposed below the first circuit board 3. Alternatively, the panel driver 5 may be mounted on other than the first circuit board 3, for example, may be mounted on the non-display area NDA of the display panel 2, or may be mounted on the second circuit board 4. The second circuit board 4 is, for example, a rigid printed circuit board. The second circuit board 4 is connected to the first circuit board 3, for example, below the first circuit board 3.

The panel driver 5 is connected to a control board (not illustrated) via the second circuit board 4, for example. The panel driver 5 performs control to display an image on the display panel 2 by driving the plurality of pixels PX based on, for example, a video signal output from the control board.

The display panel 2 may have a bent area BA indicated by hatched line. The bent area BA is an area that is bent when the display device 1 is housed in a housing of an electronic device or the like. The bent area BA is located on the terminal area MT side of the non-display area NDA. In a state where the bent area BA is bent, the first circuit board 3 and the second circuit board 4 are disposed so as to face the display panel 2.

Figure 2:
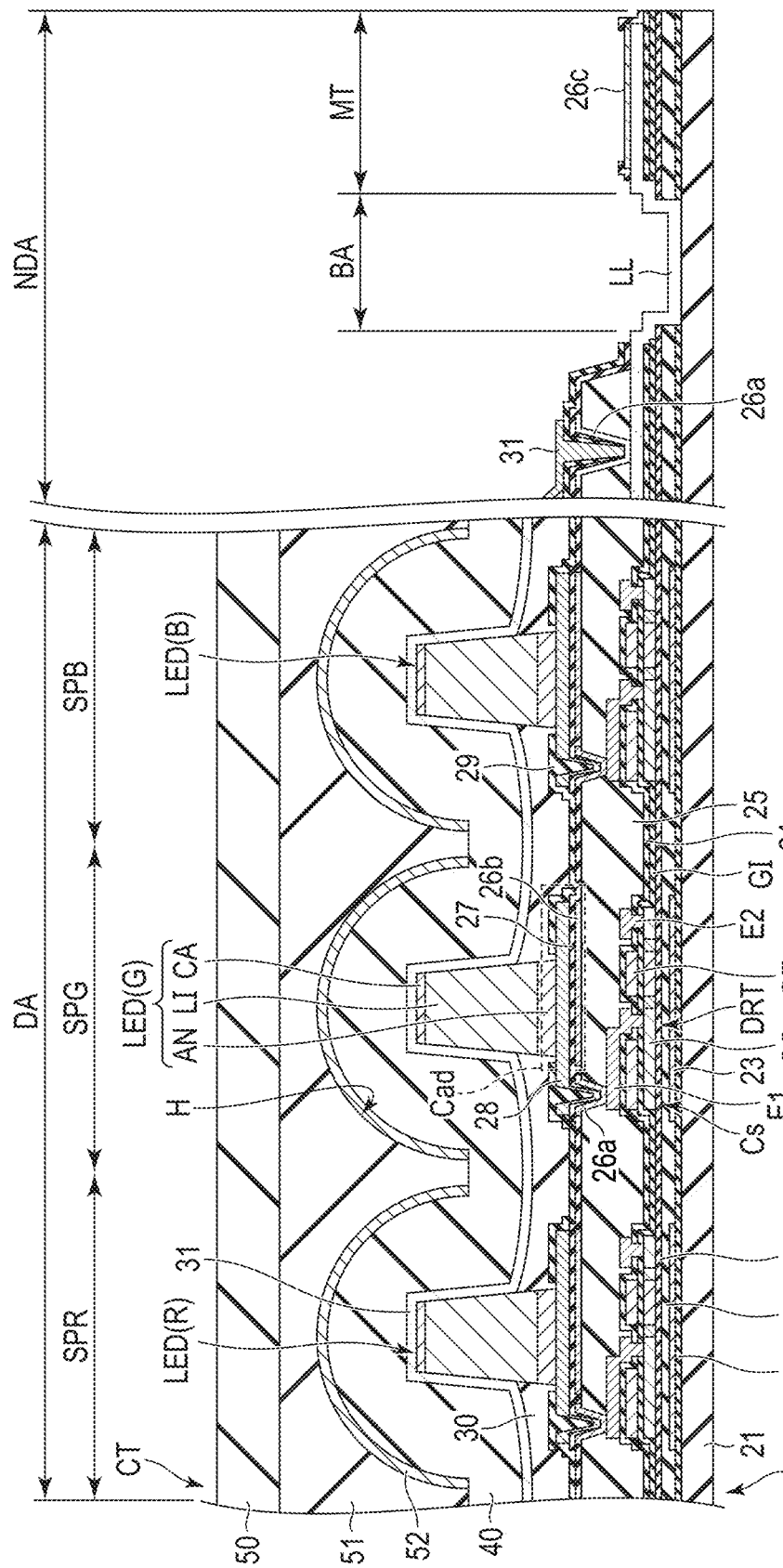
FIG. 2 is a cross-sectional view schematically illustrating an example of a cross-sectional structure of the display device according to the embodiment.

FIG. 2 schematically illustrates a cross-sectional structure of the display device 1. Here, an example in which a micro light emitting diode element called a micro LED is mounted on a substrate as a display element will be described. FIG. 2 mainly illustrates the display area DA including a thin film transistor (TFT) constituting a pixel, the terminal area MT, and the bent area BA for bending the non-display area NDA (frame area) including the terminal area MT.

The pixel PX includes three sub-pixels SPR, SPG, and SPB, for example, a red sub-pixel SPR, a green sub-pixel SPG, and a blue sub-pixel SPB. The three sub-pixels SPR, SPG, and SPB all have the same configuration.

An array substrate AR (a first substrate) of the display panel 2 illustrated in FIG. 2 includes an insulating substrate 21. The material of the insulating substrate 21 is not particularly limited as long as it can withstand the processing temperature during the TFT process, but a glass substrate such as quartz or alkali-free glass, or a resin substrate such as polyimide can be mainly used. The resin substrate has flexibility, and can constitute the display device 1 as a sheet display. The resin substrate is not limited to polyimide, and other resin materials may be used. From the above, the insulating substrate 21 may be appropriately referred to as an organic insulating layer or a resin layer.

An undercoat layer 22 having a three-layer laminated structure is provided on the insulating substrate 21. The undercoat layer 22 includes a first layer 22a made of silicon oxide ($SiO_2$), a second layer 22b made of silicon nitride (SiN), and a third layer 22c made of silicon oxide ($SiO_2$). The first layer 22a as the lowermost layer is provided in order to improve adhesion with the insulating substrate 21 that is the base material, the second layer 22b as the middle layer is provided as a block film for blocking moisture and impurities from the outside, and the third layer 22c as the uppermost layer is provided as a block film for preventing hydrogen atoms contained in the second layer 22b from diffusing to a semiconductor layer SC side to be described later.

The undercoat layer 22 is not limited to this structure. The undercoat layer 22 may be further laminated, or may have a single-layer structure or a two-layer structure. For example, when the insulating substrate 21 is glass, since the silicon nitride film has relatively good adhesion, the silicon nitride film may be directly formed on the insulating substrate 21.

A light-shielding layer 23 is disposed on the insulating substrate 21. The position of the light-shielding layer 23 is adjusted to a position where a TFT is to be formed later. In the present embodiment, the light-shielding layer 23 is formed of metal. However, the light-shielding layer 23 may be formed of a material having a light shielding property, such as a black layer.

Furthermore, in the present embodiment, the light-shielding layer 23 is provided on the first layer 22a and is covered with the second layer 22b. Unlike the present embodiment, the light-shielding layer 23 may be provided on the insulating substrate 21 and be covered with the first layer 22a.

According to such a light-shielding layer 23, since it is possible to suppress intrusion of light into the channel back surface of the TFT, it is possible to suppress a change in TFT characteristics caused by light that can be incident from the insulating substrate 21 side. Note that, in a case where the light-shielding layer 23 is formed of a conductive layer, a back gate effect can be applied to the TFT by applying a predetermined potential to the light-shielding layer 23.

A TFT (for example, a drive transistor DRT) is formed on the undercoat layer 22 described above. As the TFT, a polysilicon TFT using polysilicon for the semiconductor layer SC is taken as an example. In the present embodiment, the semiconductor layer SC is formed using low-temperature polysilicon. As the TFT, either an NchTFT or a PchTFT may be used. Alternatively, the NchTFT and the PchTFT may be formed simultaneously. Hereinafter, an example in which an NchTFT is used as the drive transistor DRT will be described.

Semiconductor layer SC of the NchTFT includes a first region, a second region, a channel region between the first region and the second region, and low-concentration impurity regions provided between the channel region and the first region and between the channel region and the second region. One of the first and second regions functions as a source region, and the other of the first and second regions functions as a drain region.

A gate insulating film GI is made of a silicon oxide film, and a gate electrode GE is made of MoW (molybdenum/tungsten). Wiring and electrodes formed on the gate insulating film GI, such as the gate electrode GE, may be referred to as a first line or a first metal. The gate electrode GE has a function as a storage capacitance electrode described later in addition to a function as a gate electrode of the TFT. Here, a top gate type TFT is described as an example, but the TFT may be a bottom gate type TFT.

An interlayer insulating film 24 is provided on the gate insulating film GI and the gate electrode GE. The interlayer insulating film 24 is formed by sequentially laminating, for example, a silicon nitride film and a silicon oxide film on the gate insulating film GI and the gate electrode GE.

The gate insulating film GI and the interlayer insulating film 24 are not provided in the bent area BA. Therefore, after the gate insulating film GI and the interlayer insulating film 24 are formed in the entire area on the insulating substrate 21 including the bent area BA, the gate insulating film GI and the interlayer insulating film 24 are patterned to remove at least a portion of the gate insulating film GI and the interlayer insulating film 24 corresponding to the bent area BA. Furthermore, since the undercoat layer 22 is exposed by removing the interlayer insulating film 24 and the like, the undercoat layer 22 is also patterned to remove a portion corresponding to the bent area BA. After the undercoat layer 22 is removed, for example, polyimide constituting the insulating substrate 21 is exposed. Note that etching of the undercoat layer 22 may cause a reduction of the film in which the upper surface of the insulating substrate 21 is partially eroded.

In this case, a line pattern may be formed below each of stepped portions at the end portion of the interlayer insulating film 24 and at the end portion of the undercoat layer 22. According to this, a lead line LL formed in the next step passes over the line pattern when crossing the stepped portion. Since the gate insulating film GI is provided between the interlayer insulating film 24 and the undercoat layer 22, and the light-shielding layer 23 is provided between the undercoat layer 22 and the insulating substrate 21, for example, a line pattern can be formed using these layers.

A first electrode E1, a second electrode E2, and the lead line LL of the TFT are provided on the interlayer insulating film 24. Each of the first electrode E1, the second electrode E2, and the lead line LL adopts a three-layer laminated structure (Ti-based/Al-based/Ti-based), and includes a lower layer made of a metal material containing Ti (titanium) as a main component, such as Ti and an alloy containing Ti, a middle layer made of a metal material containing Al (aluminum) as a main component, such as Al and an alloy containing Al, and an upper layer made of a metal material containing Ti as a main component, such as Ti and an alloy containing Ti. Note that a line or an electrode formed on the interlayer insulating film 24, such as the first electrode E1, may be referred to as a second line or a second metal.

The first electrode E1 is connected to the first region of the semiconductor layer SC, and the second electrode E2 is connected to the second region of the semiconductor layer SC. For example, when the first region of the semiconductor layer SC functions as a source region, the first electrode E1 is a source electrode, and the second electrode E2 is a drain electrode. The first electrode E1 forms the storage capacitance Cs together with the interlayer insulating film 24 and the gate electrode (the storage capacitance electrode) GE of the TFT.

The lead line LL extends to an end portion of the peripheral edge of the insulating substrate 21 and forms a terminal for connecting the first circuit board 3 and the panel driver (a driver IC) 5. Since the lead line LL is formed so as to cross the bent area BA and reach the terminal portion, the lead line LL crosses the step between the interlayer insulating film 24 and the undercoat layer 22. As described above, since the line pattern formed of the light-shielding layer 23 is formed in the stepped portion, even if the lead line LL is cut at the recess portion of the step, it is possible to maintain the conduction by contacting the lower line pattern.

A planarizing film 25 is formed on the interlayer insulating film 24, the first electrode E1, the second electrode E2, and the lead line LL so as to cover the TFT and the lead line LL. As the planarizing film 25, an organic insulating material such as photosensitive acrylic is often used. The planarizing film is excellent in coverage of line steps and surface flatness than the inorganic insulating material formed by CVD or the like.

The planarizing film 25 is removed in the pixel contact portion and the peripheral area. A conductive layer 26 is provided on the planarizing film 25. The conductive layer 26 is formed of, for example, ITO as an oxide conductive layer. The conductive layer 26 includes, for example, a conductive layer 26a covering a portion where the first electrode E1 is exposed by removing the planarizing film 25, and a conductive layer 26c covering a portion where the lead line LL is exposed.

The planarizing film 25 and the conductive layer 26 are covered with an insulating layer 27. For example, the insulating layer 27 is formed of a silicon nitride film. The pixel electrode 28 is formed on the insulating layer 27. The pixel electrode 28 is in contact with the conductive layer 26a via the opening of the insulating layer 27, and is electrically connected to the first electrode E1. Here, the pixel electrode 28 serves as a connection terminal for mounting a light emitting element LED. The pixel electrode 28 is formed of a laminate including a single conductive layer and two or more conductive layers. In the present embodiment, the pixel electrode 28 employs a two-layer laminated structure (Al-based/Mo-based), and includes a lower layer made of a metal material containing Mo as a main component, such as Mo and an alloy containing Mo, and an upper layer made of a metal material containing Al as a main component, such as Al and an alloy containing Al. Like the conductive layer 26, the pixel electrode 28 may be formed of a transparent conductive material such as ITO or IZO.

In the pixel portion, the conductive layer 26 includes a conductive layer 26b facing the pixel electrode 28. The conductive layer 26b, the insulating layer 27, and the pixel electrode 28 form an auxiliary capacitance Cad. Although not described in detail, the conductive layer 26 includes a conductive layer 26c covering the surface of the terminal portion.

An insulating layer 29 is provided on the insulating layer 27 and the pixel electrode 28. The insulating layer 29 is formed of, for example, silicon nitride. The insulating layer 29 insulates the end portion of the pixel electrode 28 and the like, and has an opening for mounting the light emitting element LED on a part of the surface of the pixel electrode 28. The size of the opening of the insulating layer 29 is desirably slightly larger than that of the light emitting element LED in consideration of the mounting deviation amount and the like in the mounting process of the light emitting element LED.

In the display area DA, the light emitting element LED is mounted on the array substrate AR. The light emitting element LED includes an anode AN, a cathode CA, and an emitting layer LI that emits light. The anode AN and the cathode CA are disposed at positions facing each other with the emitting layer LI interposed therebetween. The anode AN may be referred to as an anode terminal, and the cathode CA may be referred to as a cathode terminal.

Light emitting element LEDs having R, G, and B emission colors are prepared, and an anode-side terminal is in contact with and fixed to the corresponding pixel electrode 28. In the example illustrated in FIG. 2, a light emitting element LED having a red emission color is illustrated as an LED (R), a light emitting element LED having a green emission color is illustrated as an LED (G), and a light emitting element LED having a blue emission color is illustrated as an LED (B). In other words, the light emitting element LED (R) is a light emitting element LED included in the sub-pixel SPR, the light emitting element LED (G) is a light emitting element LED included in the sub-pixel SPG, and the light emitting element LED (B) is a light emitting element LED included in the sub-pixel SPB.

The bonding between the anode AN of the light emitting element LED and the pixel electrode 28 is not particularly limited as long as good conduction between the anode AN and the pixel electrode 28 can be secured, and the formed object of the array substrate AR is not damaged. For example, a reflow step using a low-temperature melting solder material, a method of placing the light emitting element LED on the array substrate AR via a conductive paste and then sintering the light emitting element LED, or a method of solid layer bonding such as ultrasonic bonding using a similar material for the surface of the pixel electrode 28 and the anode AN of the light emitting element can be adopted.

On the array substrate AR on which the light emitting element LED is formed, an element insulating layer 30 is provided with a film thickness that does not reach the cathode CA of the light emitting element LED. The element insulating layer 30 only needs to be able to insulate at least the anode AN and the surface of the pixel electrode 28 exposed from the anode AN. A counter electrode 31 is formed on the surface of the cathode CA of the light emitting element LED, the side wall portion of the light emitting element LED, and the element insulating layer 30, and the counter electrode 31 is in contact with the cathode CA and is electrically connected to the cathode CA. The counter electrode 31 needs to be formed as a transparent electrode in order to extract emitted light from the light emitting element LED, and is formed using, for example, ITO as a transparent conductive material. Note that the conductive layer 26 formed of ITO may be referred to as a first ITO, and the counter electrode 31 formed of ITO may be referred to as a second ITO. The counter electrode 31 commonly connects the cathodes CA of the plurality of light emitting element LEDs mounted in the display area DA, and is connected to line provided on the array substrate AR side at a cathode contact portion provided outside the display area DA.

As described above, the array substrate AR has a structure from the insulating substrate 21 to the counter electrode 31. Next, the counter substrate CT (a second substrate) facing the array substrate AR will be described. In FIG. 2, illustration of some elements overlapping the non-display area NDA among the elements constituting the counter substrate CT is omitted.

The counter substrate CT of display panel 2 illustrated in FIG. 2 includes a cover member 50 that overlaps the display area DA (and a part of the non-display area NDA). The cover member 50 can be formed of, for example, glass or a transparent resin material. Note that the cover member 50 may be formed of a non-transparent material instead of a transparent material such as glass or a transparent resin material. The cover member 50 is not an essential component, and may be omitted as appropriate. A planarizing film 51 formed of an organic insulating material such as photosensitive acrylic is provided below the cover member 50.

A hemispherical concave hole H is formed in the planarizing film 51. More specifically, the planarizing film 51 has a hemispherical concave hole H above the light emitting element LED mounted on the array substrate AR. Although details will be described later, it is desirable that the hemispherical concave hole H is formed so as to surround at least a part (specifically, a light emission surface of the light emitting element LED) of the light emitting element LED located below from the viewpoint of light extraction efficiency.

A reflector plate 52 (a concave mirror) is provided on the surface of the hemispherical concave hole H. That is, the reflector plate 52 is also formed in a hemispherical concave shape. The reflector plate 52 is formed of, for example, aluminum (Al), silver (Ag), or the like. Note that the reflector plate 52 may be formed of a metal material other than Al or Ag described above as long as the metal material has a characteristic capable of reflecting emitted light from the light emitting element LED. Hereinafter, a portion where the hemispherical concave hole H and the hemispherical concave reflector plate 52 are provided may be referred to as a lamp house or a lamp guide.

As described above, the counter substrate CT has a structure from the cover member 50 to the reflector plate 52.

The array substrate AR and the counter substrate CT are adhered by an adhesive layer 40. That is, the adhesive layer 40 is disposed between the array substrate AR and the counter substrate CT, and the lamp house described above is filled with the adhesive layer 40. From the viewpoint of light extraction efficiency, the adhesive layer 40 is desirably formed of a material having the same refractive index as the refractive index of the light emitting element LED or having a refractive index higher than that of the light emitting element LED.

Figure 3:
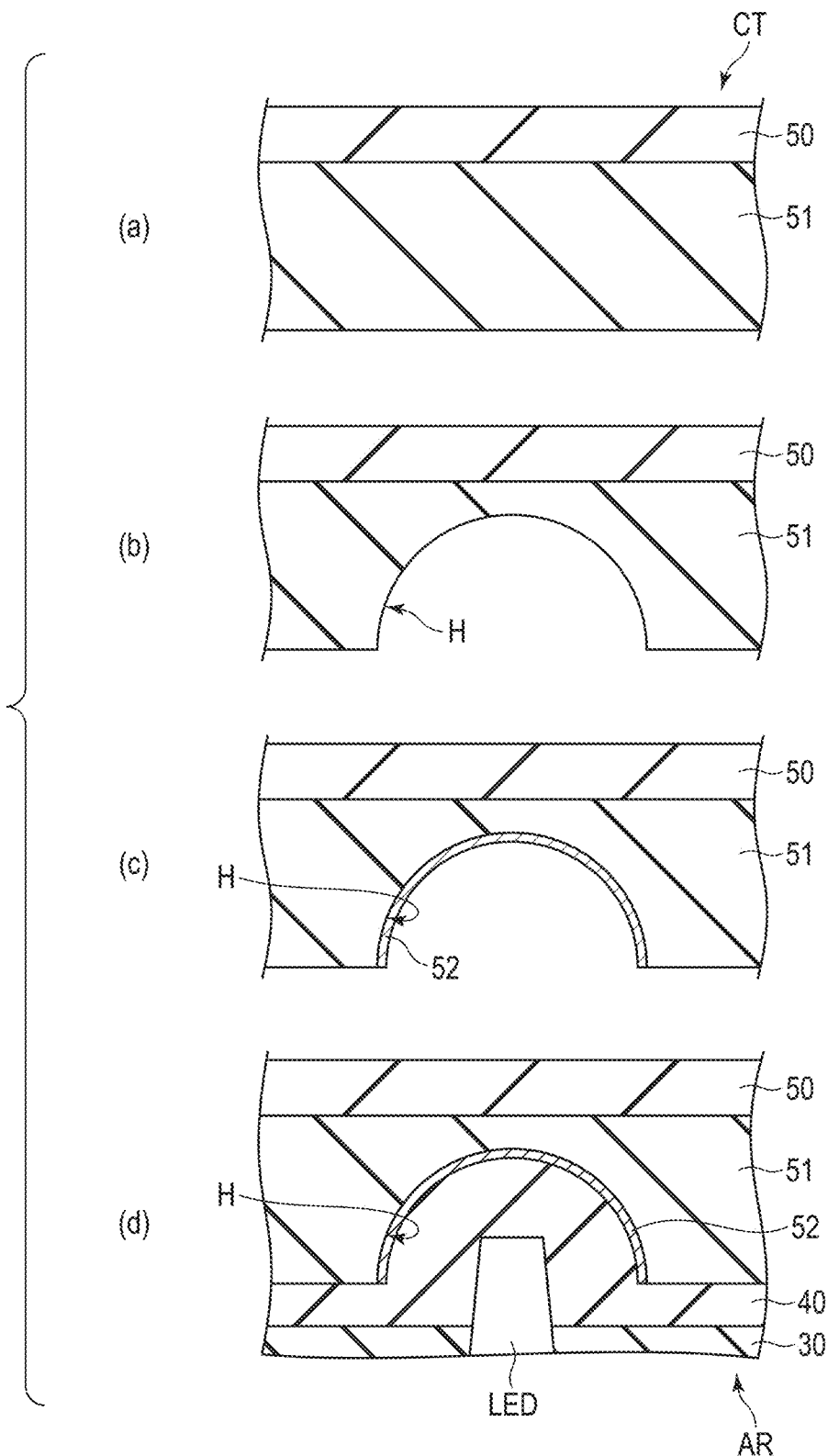
FIG. 3 is a schematic view illustrating an example of a manufacturing process of the display device according to the embodiment.

FIG. 3 is a schematic view for explaining an example of a manufacturing process of the display device 1. Here, a manufacturing process of the counter substrate CT will be mainly described. Note that, in FIG. 3, elements constituting the array substrate AR are appropriately omitted for convenience of description.

As shown in (a) of FIG. 3, after the planarizing film 51 is formed below the cover member 50 (above at the time of manufacturing), as shown in (b) of FIG. 3, patterning is performed to form the hemispherical concave hole H in the planarizing film 51. Thereafter, as illustrated in (c) of FIG. 3, a metal to be a reflective material is evaporated in the hemispherical concave hole H and patterning is performed to form the hemispherical concave reflector plate 52. Thus, the counter substrate CT is manufactured. Thereafter, as illustrated in (d) of FIG. 3, the array substrate AR manufactured separately from the counter substrate CT and the counter substrate CT manufactured by the steps illustrated in (a) to (c) of FIG. 3 are bonded by the adhesive layer 40, whereby the display device 1 is manufactured. At this time, it is desirable to bond the array substrate AR and the counter substrate CT such that at least a part of the light emitting element LED mounted on the array substrate AR enters the lamp house provided in the counter substrate CT.

Figure 4:
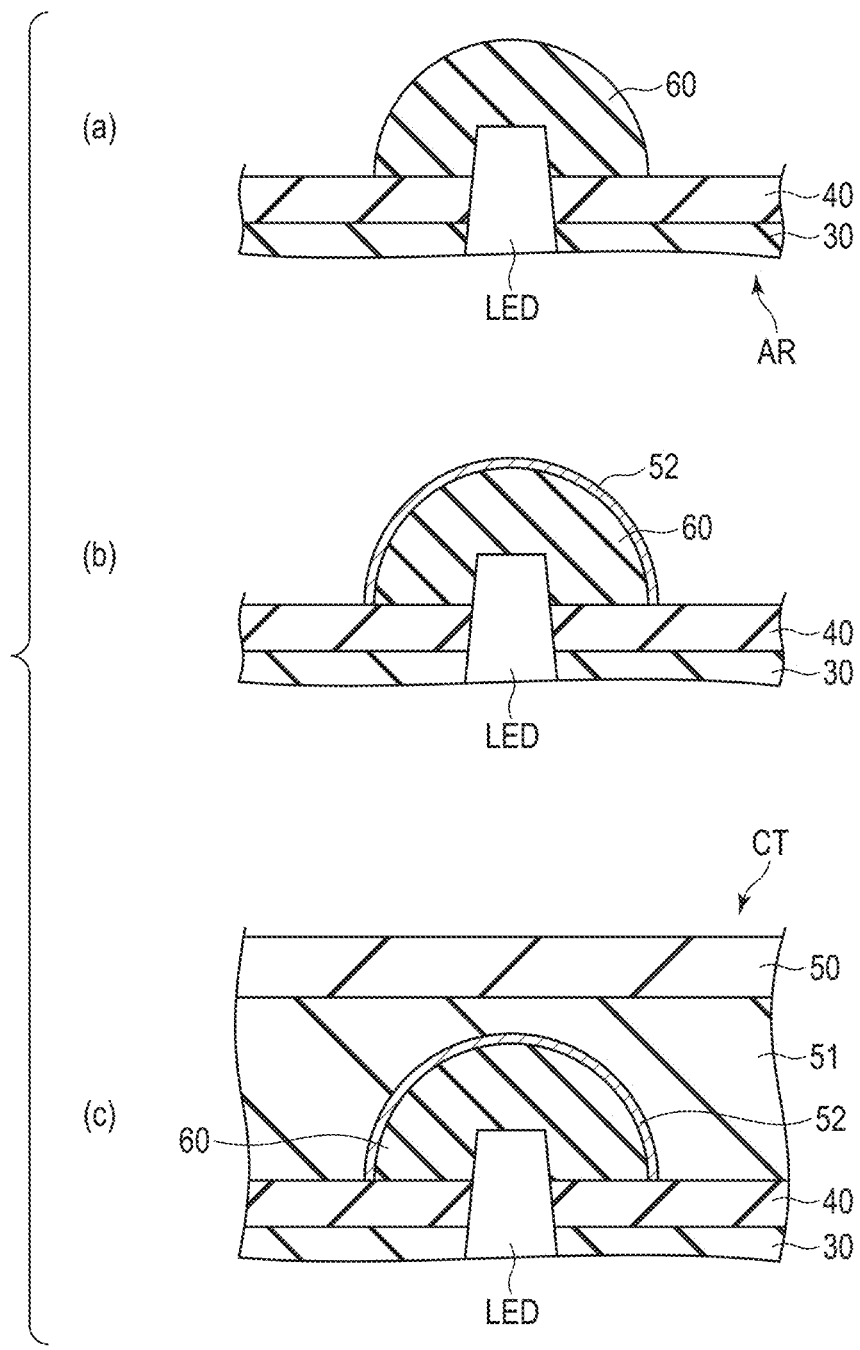
FIG. 4 is a schematic view illustrating another example of the manufacturing process of the display device according to the embodiment.

FIG. 4 is a schematic view for explaining an example of a manufacturing process of the display device 1 different from that in FIG. 3. In addition, in FIG. 4, similarly to FIG. 3, elements constituting the array substrate AR are appropriately omitted for convenience of description.

As illustrated in (a) of FIG. 4, after the array substrate AR is manufactured first and the adhesive layer 40 is formed on the array substrate AR, the structure 60 for a lamp house is formed so as to cover the light emitting element LED mounted on the array substrate AR. The lamp house structure 60 is formed of, for example, an organic insulating material such as photosensitive acrylic. Thereafter, as illustrated in (b) of FIG. 4, a metal to be a reflective material is evaporated onto the lamp house structure 60 and patterned to form the hemispherical concave reflector plate 52. Thereafter, as illustrated in (c) of FIG. 4, the planarizing film 51 is formed so as to cover the hemispherical concave reflector plate 52, and thereafter, the counter substrate CT is formed by bonding the planarizing film 51 and the cover member 50, and the display device 1 is manufactured. The display device 1 manufactured by this manufacturing process is partially different from the structure illustrated in FIG. 2 in that the lamp house is not filled with the adhesive layer 40.

Figure 5:
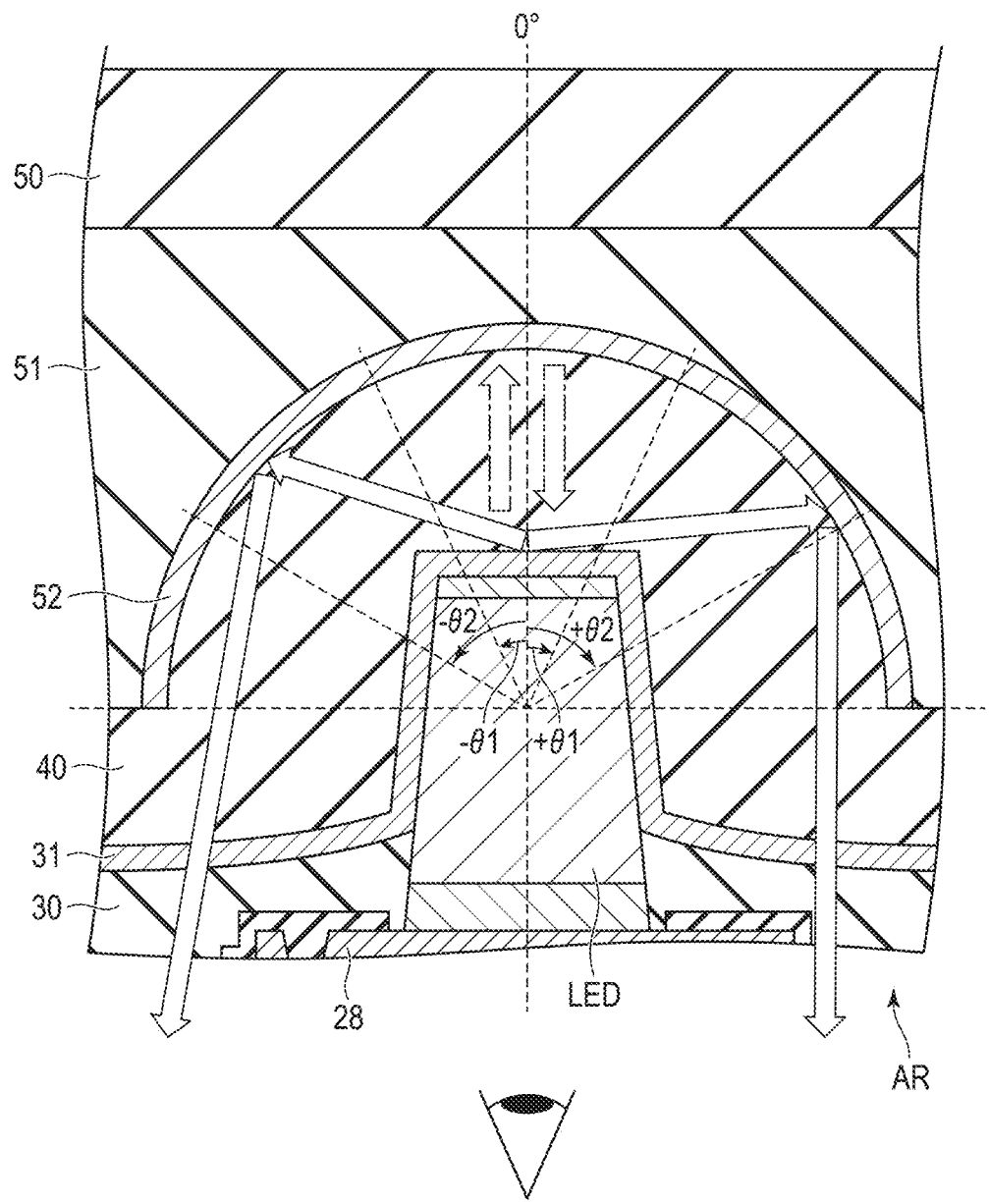
FIG. 5 is a schematic view for explaining how to extract emitted light from a light emitting element in the display device according to the embodiment.

FIG. 5 is a schematic view for explaining how to extract emitted light from the light emitting element LED mounted on the display device 1.

As indicated by solid line arrows in FIG. 5, the emitted light from the light emitting element LED is reflected by the hemispherical concave reflector plate 52 provided at a position facing the light emitting element LED, and is extracted from the array substrate AR side opposite to the light emission surface of the light emitting element LED. More specifically, among the emitted lights from the light emitting element LED, the emitted light in which an angle θ formed with the straight line (a normal line) orthogonal to the light emission surface of the light emitting element LED is within the ranges of +θ1≤θ≤+θ2 and −θ2≤θ≤−θ1 is reflected by the hemispherical concave reflector plate 52 and extracted from the array substrate AR side. Therefore, the observer observes an image displayed on (the display panel 2 of) the display device 1 from the array substrate AR side.

However, as indicated by dashed-dotted line arrows in FIG. 5, among the emitted lights from the light emitting element LED, the emitted light in which the angle θ formed with the normal line extending from the light emission surface of the light emitting element LED is within the ranges of 0°≤θ<+θ1 and −θ1<θ≤0° is hindered by the light emitting element LED when reflected by the hemispherical concave reflector plate 52, and cannot be extracted from the array substrate AR side. That is, the light corresponds to invalid light that cannot contribute to image display. Note that, although details will be described later, even if there is invalid light that cannot contribute to image display as described above, the display device 1 according to the present embodiment can improve light extraction efficiency as compared with a general display device using a micro LED.

Among the emitted lights from the light emitting element LED, the emitted light in which the angle θ formed with the normal line extending from the light emission surface of the light emitting element LED is larger than +θ2 described above cannot be extracted as the light in the frontal direction even if the emitted light is reflected by the reflector plate 52. Therefore, the light emitted at an angle larger than +θ2 is not illustrated in FIG. 5. Similarly, among the emitted lights from the light emitting element LED, the emitted light in which the angle θ formed with the normal line extending from the light emission surface of the light emitting element LED is smaller than −θ2 cannot be extracted as the light in the frontal direction even if the emitted light is reflected by the reflector plate 52. Therefore, the light emitted at an angle smaller than −θ2 is not illustrated in FIG. 5.

Hereinafter, effects of the display device 1 according to the present embodiment will be described using a comparative example. Note that the comparative example is for describing a part of the effects that the display device 1 according to the present embodiment can exhibit, and does not exclude the configurations and effects common between the comparative example and the present embodiment from the scope of the present invention.

Figure 6:
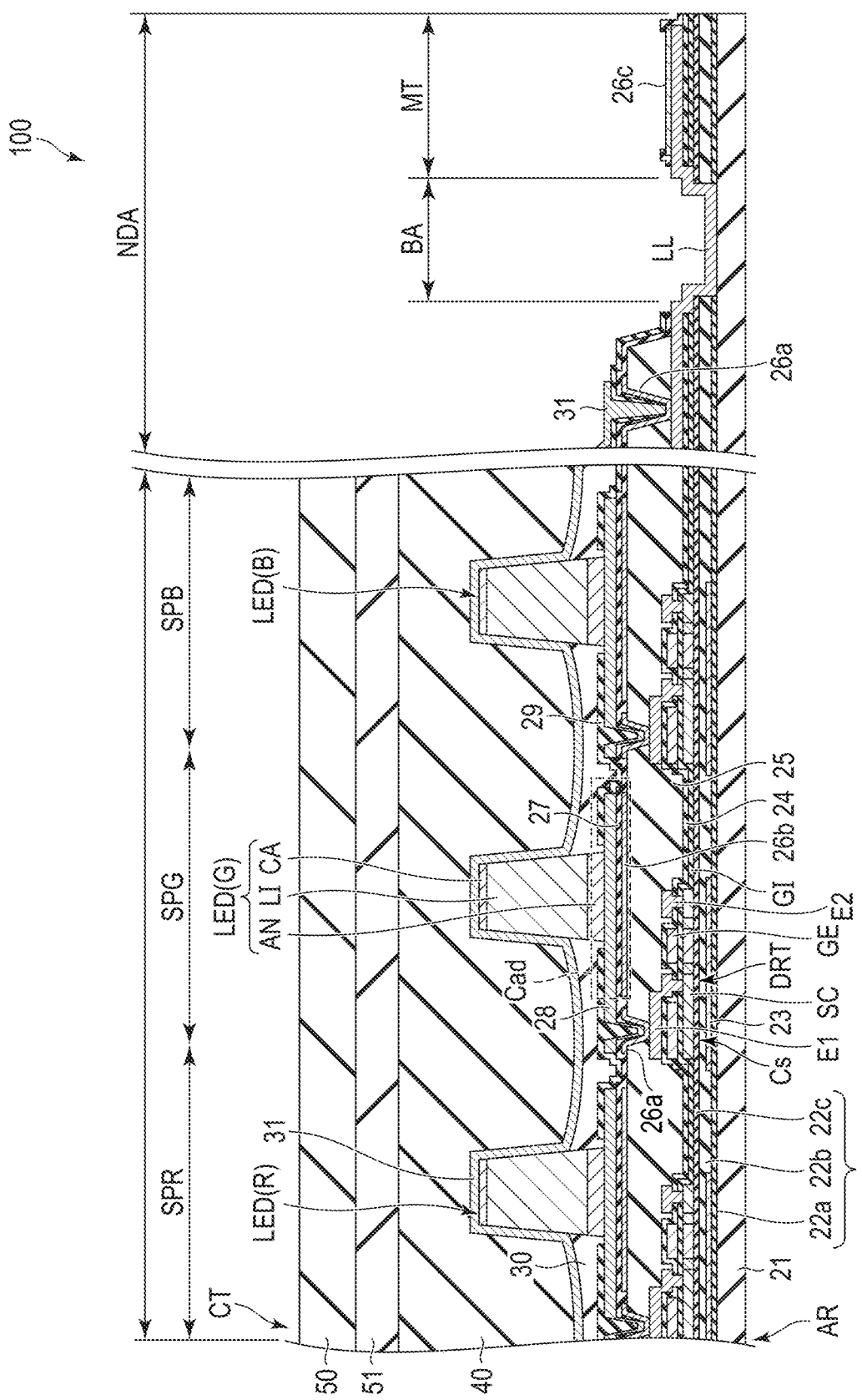
FIG. 6 is a cross-sectional view schematically illustrating an example of a cross-sectional structure of a display device according to a comparative example.
Figure 7:
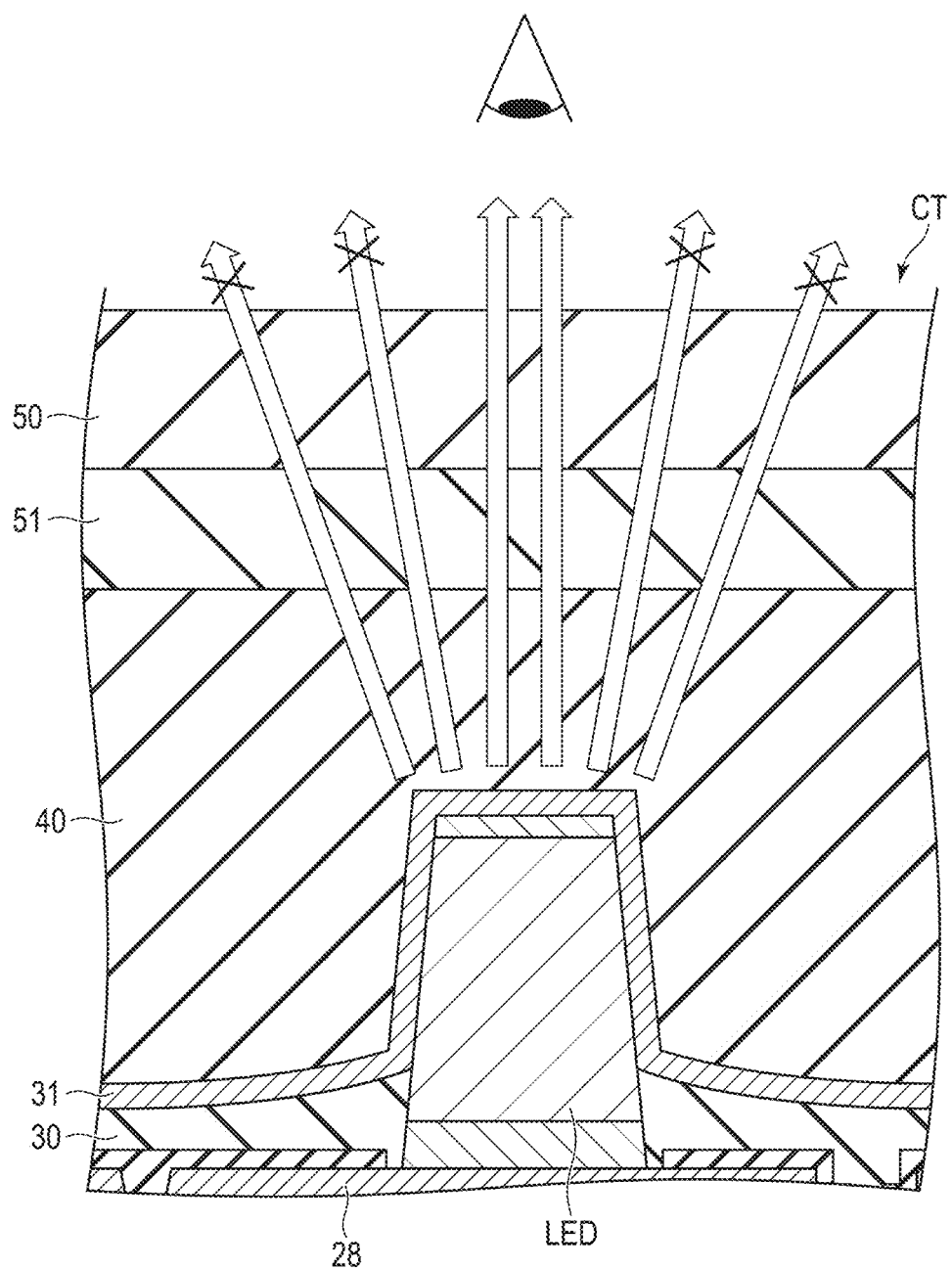
FIG. 7 is a schematic view for explaining how to extract emitted light from a light emitting element in a display device according to a comparative example.

FIG. 6 schematically illustrates a cross-sectional structure of a display device 100 according to a comparative example. FIG. 7 is a schematic view for explaining how to extract the emitted light from a light emitting element LED mounted on the display device 100 according to the comparative example.

The display device 100 according to the comparative example is different from the display device 1 according to the present embodiment in that the hemispherical concave hole H is not formed in the planarizing film 51 provided on the counter substrate CT side at a position facing the light emitting element LED (in other words, above the light emission surface of the light emitting element LED), and the reflector plate 52 provided on the surface of the hemispherical concave hole H is not provided.

In the display device 100 according to the comparative example, since there is no configuration corresponding to the reflector plate 52 in the display device 1 according to the present embodiment, the emitted light of the light emitting element LED is extracted from the counter substrate CT side. That is, the observer observes the image displayed on (a display panel of) the display device 100, not from the array substrate AR side but from the counter substrate CT side.

Generally, the light emitting element LED has characteristics of high efficiency light emission and high viewing angle characteristics, but has a characteristic that emitted light of the light emitting element LED is diffused in multiple directions as illustrated in FIG. 7. The display device 100 according to the comparative example displays an image on the display panel using the emitted light diffused in multiple directions since the extracting the emitted light is not particularly devised. However, since the emitted light used to display the image on the display panel is limited to the emitted light (in this case, the emitted light in the frontal direction as viewed from the light emission surface of the light emitting element LED) in the frontal direction of the display panel, when the image is displayed using the emitted light diffused in multiple directions as in the display device 100 according to the comparative example, there is a problem that the extraction efficiency of the emitted light is low, the amount of light in the frontal direction of the display panel decreases, and the luminance of the image decreases. This is not preferable for the observer.

In contrast to the display device 100 according to the above-described comparative example, in the display device 1 according to the present embodiment, as illustrated in FIG. 3, the hemispherical concave hole H and the hemispherical concave reflector plate 52 are provided at positions facing the light emission surface of the light emitting element LED, and the emitted light from the light emitting element LED is reflected by the reflector plate 52 and is extracted from the array substrate AR side opposite to the light emission surface of the light emitting element LED.

In the display device 1 according to the present embodiment, it is possible to condense the emitted light in the frontal direction of the display panel 2 on the side opposite to the light emission surface of the light emitting element LED by devising to reflect the emitted light from the light emitting element LED by the reflector plate 52 and extract the emitted light. Specifically, according to the study of the inventors of the present application, when ±θ1 is set to ±30°, ±θ2 is set to 65°, and the reflectance of the reflector plate 52 is set to 80%, although the emitted light within the ranges of 0°≤θ<+30° and −30°<θ≤0° corresponds to invalid light that does not contribute to the image display as described above, the emitted light within the ranges of +30°≤θ≤+65° and −65°≤θ≤−30° can be condensed in the frontal direction of the display panel 2 on the opposite side of the light emission surface of the light emitting element LED and extracted as effective light, and it becomes possible to achieve about 2.5 times the luminance as compared with the display device 100 according to the comparative example.

Here, the case where the emitted light in which the angle θ formed with the normal line extending from the light emission surface of the light emitting element LED is within the range of ±30° to ±65° is condensed and is extracted from the array substrate AR side has been described, but the values of ±θ1 and ±θ2 are not limited to the above-described values.

In addition, as illustrated in FIG. 2, the display device 1 according to the present embodiment is provided with a TFT (the drive transistor DRT) at a position overlapping the light emitting element LED below the light emitting element LED. In the display device 1 according to the present embodiment, since the light emitted from the light emitting element LED is reflected by the reflector plate 52 and is extracted from the array substrate AR side opposite to the light emission surface of the light emitting element LED, depending on the arrangement of the TFT provided below the light emitting element LED, the TFT hinders extraction of the emitted light, and there is a possibility that light extraction efficiency decreases.

However, in the display device 1 according to the present embodiment, as described above, since the TFT is provided below the light emitting element LED at a position overlapping the light emitting element LED (in other words, in planar view, a position overlapping the light emitting element LED), the light reflected by the reflector plate 52 can be extracted through both sides of the TFT without being hindered by the TFT. According to this, it is possible to suppress a decrease in the light extraction efficiency caused by the TFT provided on the array substrate AR.

Note that, in the present embodiment, as illustrated in FIG. 2, the case where the TFTs are disposed at the overlapping position below the light emitting element LEDs has been described, but the arrangement of the TFTs may be different from the arrangement of the TFTs illustrated in FIG. 2 as long as the light extraction efficiency is not reduced when the emitted light is extracted from the array substrate AR side.

Figure 8:
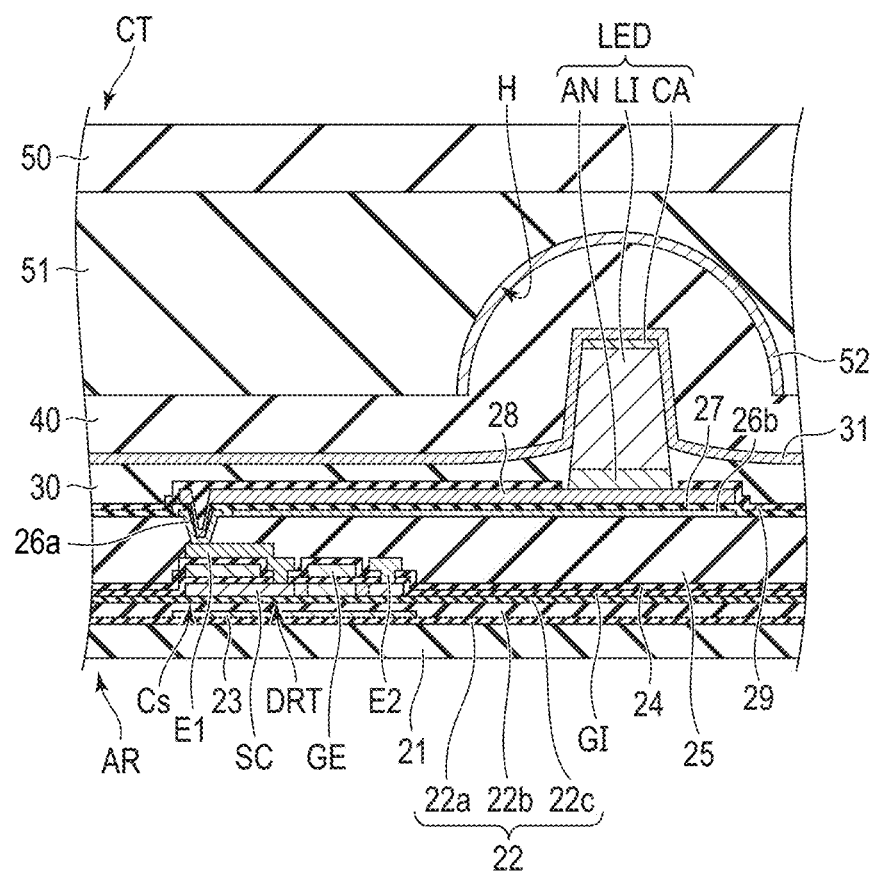
FIG. 8 is a cross-sectional view schematically illustrating another example of the cross-sectional structure of the display device according to the embodiment.

Specifically, as illustrated in FIG. 8, the TFT may be provided below the light emitting element LED at a position not overlapping the light emitting element LED, more specifically, at a position not overlapping the hemispherical concave hole H. According to this, similarly to the above, since there is no element that hinders the light reflected by the reflector plate 52 below the light emitting element LED, it is possible to suppress a decrease in the light extraction efficiency. However, in the case of this arrangement, since the area occupied by each component regarding one light emitting element LED increases, the number of light emitting element LEDs that can be arranged in the display area DA may decrease as compared with the configuration illustrated in FIG. 2.

In addition, in the present embodiment, the case where a part of the light emitting element LED is in the hemispherical concave hole H (in other words, in the lamp house), that is, the case where a part of the light emitting element LED is surrounded by the hemispherical concave hole H has been described. However, the light emitting element LED may be disposed below the hemispherical concave hole H and may not be surrounded by the hemispherical concave hole H. However, when a part of the light emitting element LED is surrounded by the hemispherical concave hole H, the emitted light from the light emitting element LED does not leak to the counter substrate CT side. Therefore, from the viewpoint of light extraction efficiency, it is desirable that a part of the light emitting element LED is surrounded by the hemispherical concave hole H.

As described above, the display device 1 according to the present embodiment includes the array substrate AR on which the light emitting element LED is mounted and the counter substrate CT facing the array substrate AR, and the counter substrate CT includes the reflector plate 52 at a position above the light emitting element LED and facing the light emission surface of the light emitting element LED. According to this, the emitted light emitted from the light emitting element LED can be reflected by the reflector plate 52 and be condensed in the frontal direction of the display device 1. That is, the amount of light in the frontal direction of the micro LED display (the display device 1) can be improved.

In the present embodiment, the case where the cathode CA is disposed at a position facing the anode AN via the light emitting element LED as illustrated in FIG. 2 (in other words, when the anode AN and the cathode CA are vertically placed) has been described, but the arrangement of the anode AN and the cathode CA may be different from the arrangement illustrated in FIG. 2.

Figure 9:
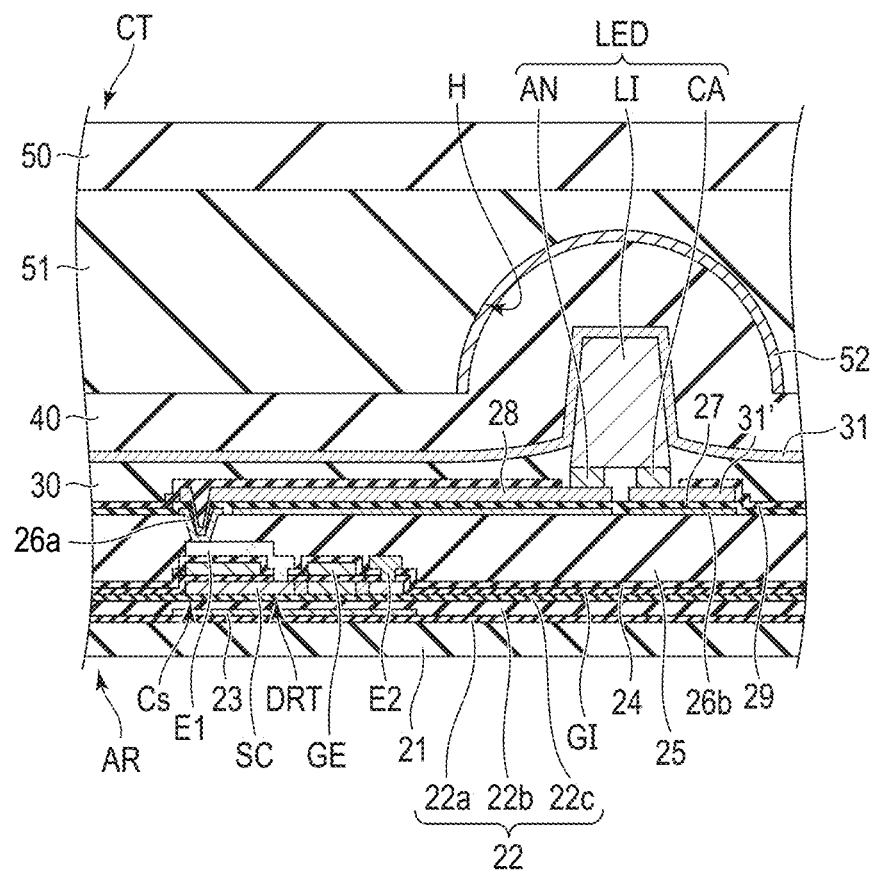
FIG. 9 is a cross-sectional view schematically illustrating still another example of the cross-sectional structure of the display device according to the embodiment.

Specifically, as shown in FIG. 9, the anode AN and the cathode CA may be disposed in the same layer at intervals (in other words, the anode AN and the cathode CA may be horizontally disposed). In this case, the common electrode 31' connected to the cathode CA is disposed at a predetermined interval in the lateral direction in the same layer of the pixel electrode 28 connected to the anode AN. Even with such a configuration, it is similar to the configuration shown in FIG. 2 described above except that the arrangement of the anode AN and the cathode CA is different from the arrangement of the pixel electrode 28 connected to the anode AN and the common electrode 31' connected to the cathode CA, and thus, it is possible to obtain effects similar to the various effects described above.

The gap between the anode AN and the cathode CA and the gap between the pixel electrode 28 and the common electrode 31' illustrated in FIG. 9 are planarized using, for example, a resin material along the upper surfaces of the anode AN and the cathode CA of the light emitting element LED. The common electrode 31' may be continuously formed so as to be in contact with the cathodes CA of each light emitting element LEDs (IOT sputtering or the like).

Hereinafter, modifications of the display device 1 according to the present embodiment will be described.

MODIFIED EXAMPLE

Figure 10:
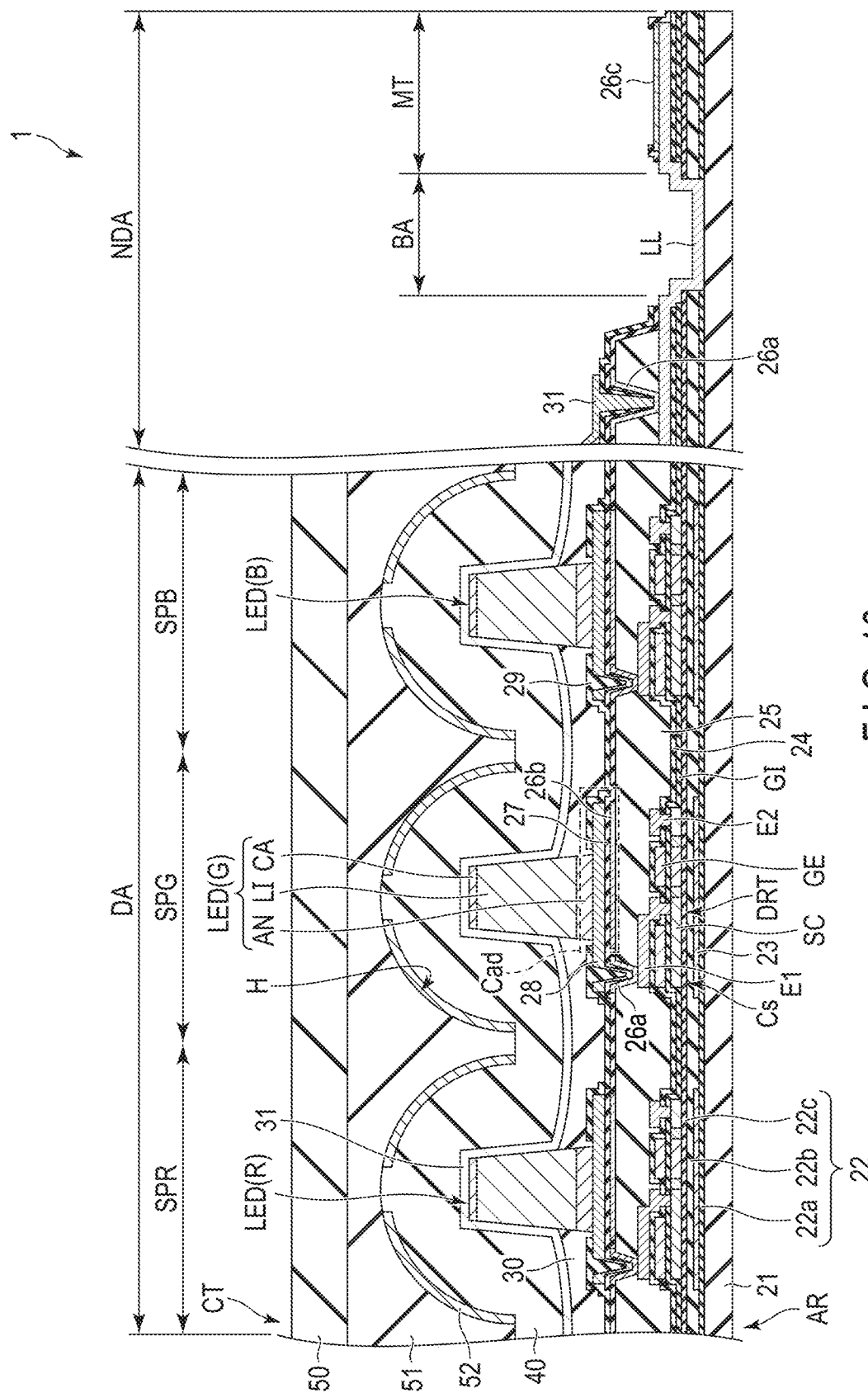
FIG. 10 is a cross-sectional view schematically illustrating an example of a cross-sectional structure of a display device according to a modification of the embodiment.
Figure 11:
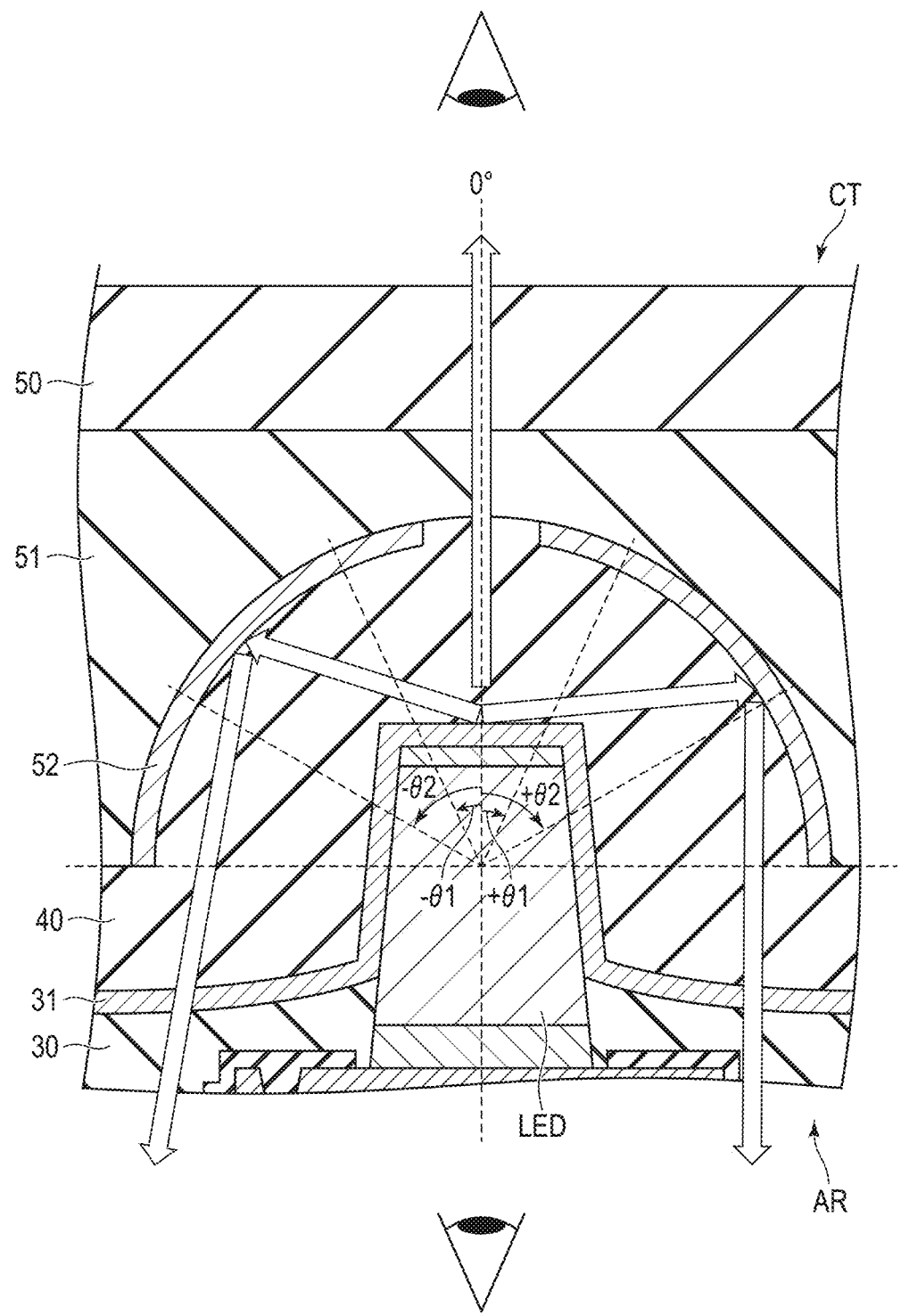
FIG. 11 is a schematic view for explaining how to extract emitted light from a light emitting element in a display device according to the modification of the embodiment.

FIG. 10 schematically illustrates a cross-sectional structure of a display device 1 according to a modification of the present embodiment. FIG. 11 is a schematic view for explaining how to extract emitted light from the light emitting element LED mounted on the display device 1 according to the modification.

As illustrated in FIG. 10, the display device 1 according to the modification is different from the structure illustrated in FIG. 2 in that the reflector plate 52 is not provided on the entire surface of the hemispherical concave hole H formed in the planarizing film 51 on the counter substrate CT side, in other words, the reflector plate 52 provided on the surface of the hemispherical concave hole H has an opening in the normal direction orthogonal to the light emission surface of the light emitting element LED. That is, the adhesive layer 40 and the planarizing film 51 are also in contact with each other in the hemispherical concave hole H through the opening of the reflector plate 52. In the case of the structure illustrated in FIG. 10, the cover member 50 is desirably formed of a transparent material such as glass or a transparent resin material.

In the case of the structure illustrated in FIG. 2, as illustrated in FIG. 5, among the emitted lights from the light emitting element LED, the emitted light in which the angle θ formed with the normal line extending from the light emission surface of the light emitting element LED is within the ranges of $0°θ<+θ1$ and $-θ1<θ≤0°$ corresponds to invalid light that cannot contribute to the image display. On the other hand, in the case of the display device 1 according to the modification, as illustrated in FIG. 11, among the emitted lights from the light emitting element LED, the emitted light in which the angle θ formed with the normal line extending from the light emission surface of the light emitting element LED is within the ranges of $0°≤θ≤+θ1$ and $-θ1<θ≤0°$ can be extracted from the counter substrate CT side, and the emitted light beams in which the angle θ formed with the normal line extending from the light emission surface of the light emitting element LED is within the ranges of $+θ1≤θ≤+θ2$ and $-θ2≤θ≤-θ1$ can be extracted from the array substrate AR side.

According to this, the observer can observe the image displayed on the display device 1 not only from the array substrate AR side but also from the counter substrate CT side. That is, according to the present modification, it is possible to provide the display device 1 capable of obtaining the same effects as the various effects already described and capable of observing images from both the array substrate AR side and the counter substrate CT side.

According to the embodiment described above, it is possible to provide a display device capable of improving the amount of light in the frontal direction of the micro LED display.

Based on the display device which has been described in the above-described embodiments, a person having ordinary skill in the art may achieve a display device with an arbitral design change; however, as long as they fall within the scope and spirit of the present invention, such a display device is encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A display device comprising:
a first substrate on which a light emitting element is mounted; and
a second substrate that faces the first substrate;
wherein
the second substrate includes a hemispherical concave hole, and a reflector plate at a position above the light emitting element and facing a light emission surface of the light emitting element,
the reflector plate is provided on a surface of the hemispherical concave hole, and
the light emitting element is arranged in the hemispherical concave hole,
the light emitting element is a light emitting diode having an anode, a cathode, and a light emitting layer which emits a light and is located between the anode and the cathode,
the reflector plate has an opening which is smaller than the cathode at an area facing the cathode, and
a part of the light emitted from the light emitting element passes through the first substrate, and another part of the light emitted from the light emitting element passes through the opening and the second substrate.

2. The display device of claim 1, further comprising
an adhesive layer that adheres the first substrate and the second substrate to each other,
wherein
the adhesive layer has a refractive index same as a refractive index of the light emitting element or a refractive index higher than a refractive index of the light emitting element, and
the hemispherical concave hole is filled with the adhesive layer.

3. The display device of claim 1, wherein
the first substrate further includes a drive transistor that is disposed below the light emitting element and controls a current supplied to the light emitting element, and
the drive transistor is disposed at a position overlapping with the light emitting element in planar view.

4. The display device of claim 1, further comprising
a drive transistor that is disposed below the light emitting element and controls a current supplied to the light emitting element,
wherein
the drive transistor is disposed at a position not overlapping with the hemispherical concave hole in planar view.

5. The display device of claim 1, wherein
the reflector plate reflects, among emitted lights from the light emitting element, the emitted light having an angle θ with a normal direction of a light emission surface of the light emitting element within ranges of $30°≤θ≤65°$ and $-65°≤θ≤-30°$ toward the first substrate side.

6. The display device of claim 1, wherein
the reflector plate transmits, among emitted lights from the light emitting element, the emitted light having an angle θ with a normal direction of the light emission surface of the light emitting element within ranges of $0°≤θ<30°$ and $-30°<θ≤0°$ to the second substrate side through the opening.

* * * * *